United States Patent [19]

Sato et al.

[11] Patent Number: 5,397,678
[45] Date of Patent: Mar. 14, 1995

[54] IMAGE FORMATION METHOD USING A PHOTOSENSITIVE TRANSFER MATERIAL

[75] Inventors: Morimasa Sato; Masayuki Iwasaki; Fumiaki Shinozaki; Koji Inoue, all of Shizuoka, Japan

[73] Assignee: Fuji Photo Film Co., Ltd., Kanagawa, Japan

[21] Appl. No.: 216,327

[22] Filed: Mar. 23, 1994

Related U.S. Application Data

[62] Division of Ser. No. 996,126, Dec. 23, 1992, abandoned.

Foreign Application Priority Data

Apr. 9, 1992 [JP] Japan .................... 4-88875

[51] Int. Cl.$^6$ ............................................. G03C 11/12
[52] U.S. Cl. ..................................... 430/258; 430/256; 430/269
[58] Field of Search ............... 430/258, 256, 257, 262, 430/270, 360, 269

[56] References Cited

U.S. PATENT DOCUMENTS

| | | | |
|---|---|---|---|
| 3,884,693 | 5/1975 | Bauer et al. | 430/263 |
| 4,559,292 | 12/1985 | Geissler et al. | 430/256 |
| 4,744,834 | 5/1988 | Haq | 134/38 |
| 4,766,053 | 8/1988 | Shinozaki et al. | 430/256 |
| 4,902,363 | 2/1990 | Delaney et al. | 430/252 |
| 5,158,857 | 10/1992 | Shinozaki et al. | 430/262 |
| 5,292,613 | 9/1993 | Sato et al. | 430/257 |
| 5,294,516 | 10/1993 | Sato et al. | 430/262 |
| 5,298,360 | 3/1994 | Sato et al. | 430/256 |

FOREIGN PATENT DOCUMENTS 0373438 12/1989 European Pat. Off. .

*Primary Examiner*—Charles L. Bowers, Jr.
*Assistant Examiner*—Geraldine Letscher
*Attorney, Agent, or Firm*—Sughrue, Mion, Zinn, Macpeak & Seas

[57] ABSTRACT

A photosensitive transfer material comprises a temporary substrate having provided thereon an alkali-soluble thermoplastic resin layer, an intermediate layer, and a photosensitive resin layer in this order, the interlaminar adhesion in the transfer material being the smallest at the interface between the thermoplastic resin layer and the temporary substrate. The photosensitive resin layer can be transferred to a permanent substrate without involving failure due to fine dust, air bubbles or unevenness of the permanent substrate. An image can be formed with the transfer material by adhering the transfer material to a permanent substrate at least under heat and, after stripping the temporary substrate, imagewise exposing the photosensitive resin layer to light, and processing the transferred layers to develop the photosensitive resin layer. If the thermoplastic resin layer and the intermediate layer are first removed with a processing method with which the photosensitive resin layer is not substantially developed and then the photosensitive resin layer is developed using a processing solution other than used for revmoving the thermoplastic resin layer and the intermediate layer, excessive fatigue of the developing solution for the photosensitive resin layer and unevenness of development can be prevented.

3 Claims, No Drawings

IMAGE FORMATION METHOD USING A PHOTOSENSITIVE TRANSFER MATERIAL

This is a divisional of application Ser. No. 07/996,126, filed Dec. 23, 1992, now abandoned.

FIELD OF THE INVENTION

This invention relates to a photosensitive transfer material suitable for dry transfer onto a substrate with an uneven surface and to an image formation method using the same. The photosensitive transfer material and image formation method according to the present invention are suited for the production of color filters to be used in liquid crystal displays, etc. or for the production of printed circuit boards, etc.

BACKGROUND OF THE INVENTION

Image forming materials for transferring a photosensitive resin layer onto a substrate are known from, for example, JP-B-56-40824 (U.S. Pat. No. 3,884,693; the term "JP-B" as used herein means an "examined published Japanese patent application"). These types of image forming materials are used in the manufacture of printed circuit boards, intaglio or relief printing plates, name plates, multicolor printing proofs, offset printing plates, screen printing stencils, etc. The transfer material is composed of a temporary substrate, a separating layer, and a photopolymerizable layer, and image formation using the transfer material is carried out by adhering the photopolymerizable layer to a permanent substrate, stripping the temporary substrate off the transfer material, exposing the photopolymerizable layer to light via the separating layer, and developing the exposed photopolymerizable layer to form an image on the permanent substrate. The separating layer serves as an oxygen barrier so that the transfer material can be handled and exposed in an air atmosphere. Having a very small thickness of from about 0.5 to 5 $\mu$m, the separating layer does not adversely affect the resolving power.

However, where the substrate to which a photopolymerizable layer is to be transferred has an uneven surface, it often happens that air bubbles are formed between the substrate and the very thin photopolymerizable layer, resulting in a failure of transfer.

JP-A-2-213849 (European Patent 373,438; the term "JP-A" as used herein means an "unexamined published Japanese patent application") discloses a transfer material having an intermediate layer of a polyvinyl alcohol derivative, etc. between a temporary substrate and a photosensitive resin layer. Provision of the intermediate layer is directed to improving releasability of the temporary substrate and dissolving characteristics of the intermediate layer, with no consideration being given to transfer properties in the case where the transfer material is transferred to a permanent substrate having an uneven surface.

JP-A-63-309946 (U.S. Pat. Nos. 4,902,363 and 4,939,029) points out the occurrence of transfer failure due to insufficient adhesion of a transfer layer to a permanent substrate where the substrate has fine irregularities on its surface or where the substrate and/or the transfer layer have thereon fine particles such as refuse and dust. In order to prevent such adhesion failure, the publication teaches the use of a compressive temporary substrate. This means is certainly effective but is still insufficient for preventing of forming bubbles where a non-tacky photosensitive resin layer is transferred at room temperature to a substrate with a surface roughness equal to the thickness of the photosensitive resin layer.

Japanese Patent Application No. 120228/91 (corresponding to U.S. Pat. No. 5,292,613) discloses a transfer method using a photosensitive transfer material comprising a temporary substrate, particularly a gelatin-coated plastic film, having thereon a thermoplastic resin layer, a separating layer, and a photosensitive resin layer in this order, in which the photosensitive resin layer is adhered to a permanent substrate, and the temporary substrate and the thermoplastic resin layer are simultaneously stripped off to transfer the photosensitive resin layer onto the permanent substrate. According to this method, however, release between the thermoplastic resin layer and the separating layer is not always easily controlled, which is a disadvantage in automating the release operation.

SUMMARY OF THE INVENTION

An object of the present invention is to provide a photosensitive transfer material which can achieve transfer of the photosensitive resin layer thereof to a permanent substrate without involving transfer failure due to fine dust, air bubbles, unevenness of the permanent substrate surface, and to provide an image formation method using the same.

Another object of the present invention is to provide a photosensitive transfer material which enables exposure to light in air, and to provide an image formation method using the same.

A further object of the present invention is to provide a photosensitive transfer material which can achieve transfer of the photosensitive resin layer thereof to a permanent substrate with satisfactory release from its temporaty substrate, and to provide an image formation method using the same.

A still further object of the present invention is to provide a photosensitive transfer material which forms an image on a permanent substrate without contaminating the substrate, and to provide an image formation method using the same.

A still further object of the present invention is to provide a photosensitive transfer material which prevents an electrical shock or attraction of dust due to electrification on stripping the temporary substrate, and to provide an image formation method using the same.

A still further object of the present invention is to provide an image formation method which prevents fatigue of a developing solution or unevenness of development.

The first to fourth objects of the present invention can be accomplished by a photosensitive transfer material comprising a temporary substrate having provided thereon an alkali-soluble thermoplastic resin layer, an intermediate layer, and a photosensitive resin layer in this order, the interlaminar adhesion in the transfer material being the smallest at the interface between the thermoplastic resin layer and the temporary substrate. The first to fourth objects of the present invention can also be accomplished by an image formation method using such a photosensitive transfer material which comprises adhering the photosensitive resin layer to a permanent substrate at least under heat and, if desired, under pressure, stripping the temporary substrate off the alkali-soluble thermoplastic resin layer, imagewise exposing the photosensitive resin layer to light preferably through the alkali-soluble thermoplastic resin layer and the intermediate layer, and developing the photosensitive resin layer to form an image on the permanent substrate.

The fifth object of the present invention can be accomplished by a photosensitive transfer material having the above-mentioned structure and further characterized in that the temporary substrate has a surface resistivity of not more than $10^{13}$ Ω.

The sixth object of the present invention can be accomplished by an image formation method comprising removing the alkali-soluble thermoplastic resin layer and the intermediate layer by using a processing solution capable of dissolving the alkali-soluble thermoplastic resin layer and the intermediate layer but substantially incapable of developing the photosensitive resin layer and then developing the photosensitive resin layer.

The photosensitive transfer material according to the present invention comprises a temporary substrate, an intermediate layer, and a photosensitive resin layer, with a thermoplastic resin layer having a cushioning effect and satisfactory release properties from the temporary substrate being interposed between the temporary substrate and the intermediate layer. The photosensitive resin layer can be adhered to a permanent substrate with an uneven surface without entrapping air bubbles owing to the cusioning effect of the thermoplastic resin layer, and the photosensitive resin layer and the intermediate layer can easily be transferred to the permanent substrate by stripping off the temporary substrate with satisfactory release. A monochromatic or multicolor image can thus be formed on the permanent substrate through an easy transfer operation with the photosensitive transfer material of the present invention.

DETAILED DESCRIPTION OF THE INVENTION

The temporary substrate which can be used in the present invention preferably is made of a material which is satisfactorily releasable (i.e., sufficient to carry out development the photosensitive resin layer) from a thermoplastic resin layer, which is chemically and thermally stable, and which is flexible. Suitable temporary substrates include a thin sheet of polyethylene terephthalate, polycarbonate, polyethylene, polypropylene, etc. and laminates thereof.

In order to obtain satisfactory releasability, the temporary substrate to be used should not be subjected to a surface treatment, such as a glow discharge treatment nor should it be provided with a under coating layer of gelatin, etc.

The thickness of the temporary substrate suitably from about 5 to about 300 μm, and preferably is from about 20 to about 150 μm.

In some cases, depending on the transfer conditions, a thermoplastic resin may ooze out to the sides during the transfer process and contaminate the permanent substrate. Since in the present invention a thermoplastic resin which is soluble in an aqueous alkaline solution is used such contamination can be avoided. Having alkali solubility, the thermoplastic resin contaminating the substrate can be removed with ease in a subsequent processing step.

The aqueous alkaline solution for removal of the thermoplastic resin may or may not be the same as the alkaline developing solution to be used for development of a photosensitive resin. The expression "aqueous alkaline solution" as used herein means a dilute aqueous solution of an alkaline substance which may contain a small amount of an organic solvent miscible with water in order to accelarate permiation of the solution into the resin. Suitable alkaline substances include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide), and sodium tertiary phosphate. The aqueous alkaline solution preferably contains the alkaline substance in a concentration of from about 0.01 to about 30% by weight base on the total weight of the solution (the same hereinafter) and has a pH ranging from about 8 to about 14.

The water-miscible organic solvents which may be present in the aqueous alkaline solution include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the water-miscible organic solvent is from about 0.1 to about 30% by weight. The aqueous alkaline solution may further contain a conventional surface active agent in a concentration preferably of from about 0.01 to about 10% by weight.

The thermoplastic resin composition constituting the thermoplastic resin layer preferably has a softening point of not higer than about 80° C. and of higher than room temperature. Specific examples of alkali-soluble thermoplastic resins having a softening point of not more than about 80° C. are a saponification product of an ethylene-acrylic ester copolymer, a saponification product of a styrene-(meth)acrylic ester copolymer, a saponification product of a vinyltoluene(meth)acrylic ester copolymer, poly(meth)acrylates, a saponification product of a (meth)acrylic ester copolymer such as a (meth)acrylic ester and vinyl acetate copolymer (e.g., a butyl (meth)acrylate-vinyl acetate copolymer), and mixtures thereof. In addition, alkali-soluble organic high polymers selected from those having a softening point of about 80° C. or lower described in *Plastic Seino Binran*, edited by Nippon Plastic Kogyo Renmei (Japan Plastics Industry Association) and Zen-Nippon Plastic Seikei Kogyo Rengokai (All Japan Federation of Plastics Molding Industry), published by Kogyo Chosakai (industrial Investigation Commission) (Oct. 25, 1968) can be employed. Further, organic high polymers whose softening point is above about 80° C. may also be used in combination with various plasticizers compatible therewith so as to drop the substantial softening point to about 80° C. or less. For the purpose of controlling adhesion to a temporary substrate, these organic high polymers may contain various other polymers, supercooling substances, adhesion improving agents, surface active agents, parting agents, and so on as long as the substantial softening point does not exceed 80° C.

Examples of suitable plasticizers are polypropylene glycol, polyethylene glycol, dioctyl phthalate, diheptyl phthalate, dibutyl phthalate, tricresyl phosphate, cresyl diphenyl phosphate, and biphenyl diphenyl phosphate.

The thermoplastic resin layer preferably has a thickness of at least 6 $\mu$m more preferably at least 10 $\mu$m, and most preferably at least 12 $\mu$m. If the thickness of this layer is 5 $\mu$m or less, the layer may fail to completely absorb the unevenness of 1 $\mu$m or more of a permanent substrate. The preferred upper limit of the thickness of the thermoplastic resin layer is about 100 $\mu$m, more preferably about 50 $\mu$m, and particularly about 25 $\mu$m from the standpoint of developability and production suitability.

The intermediate layer is provided to prevent permeation of oxygen into the photosensitive material, especially which is comprised a photopolymerizable composition. Such a layer prevents photopolymerization radical from comsumption by oxygen. The intermediate layer can also acts to prevent contamination of the photosensitive resin by the thermoplastic resin composition.

The material for the intermediate layer is not particularly limited and the intermediate layer may be prepared from conventional materials as long as it is dispersible or soluble in water or an aqueous alkaline solution and exhibits low oxygen permeability. Sutable materials for the intermediate layer include those described in JP-A-46-2121 (Canadian Patent 992,789) and JP-B-56-40824 (U.S. Pat. No. 3,884,693), etc., for example, polyvinyl ether/maleic anhydride polymers, water-soluble salts of a carboxyalkyl cellulose, water-soluble cellulose ethers, water-soluble salts of carboxyalkylated starch, polyvinyl alcohol, polyvinyl pyrrolidone, various polyacrylamides, various water-soluble polyamides, water-soluble salts of polyacrylic acid, gelatin, ethylene oxide polymers, water-soluble salts of various types of starch and analogues thereof, styrene-maleic acid copolymers, maleate resins, and combinations of two or more thereof.

Of these materials, a combination of polyvinyl alcohol and polyvinyl pyrrolidone is preferred. The polyvinyl alcohol to be used preferably has a degree of saponification of at least 80%. The proportion of polyvinyl pyrrolidone in the combination preferably is from about 1 to about 75% by weight, more preferably from about 1 to about 60% by weight, and most preferably from about 10 to about 50% by weight, based on the total solids content of the intermediate layer. If it is less than 1% by weight, sufficient adhesion to the photosensitive resin layer may not be obtained. If it exceeds 75% by weight, the oxygen barrier properties of the intermediate layer would be reduced.

The intermediate layer is very thin, preferably having a thickness of from about 0.1 to about 5 $\mu$m, and more preferably from about 0.5 to about 2 $\mu$m. If the thickness is less than about 0.1 $\mu$m, the oxygen permeability is too high. If the thickness exceeds about 5 $\mu$m, development or removal of the intermediate layer would tend to take too much time, and absorption of the unevenness of the surface of the parmanent substrate would tend to be difficult.

It is preferable that the photosensitive resin layer soften and become tacky at a temperature of 150° C. or lower and higher than room temperature (e.g., 25° C.) and that it be thermoplastic. Most photosensitive resin layers obtained from known photopolymerizable compositions have the above-mentioned characteristics.

Some of the known photopolymerizable compositins may be further modified by addition of a thermoplastic resin binder or a compatible plasticizer.

Any of the known photosensitive resins described, e.g., in JP-A-3-282404 (U.S. Pat. No. 5,155,005) may be used as materials for the photosensitive resin layer of the present invention. Suitable photosensitive resins include photosensitive compositions comprising a negative type diazo resin and a binder, photopolymerizable compositions, photosensitive resin compositions comprising an azide compound and a binder, and cinnamic acid-type photosensitive resin compositions, with photopolymerizable compositions being particularly preferred. The photopolymerizable compositions basically comprise a photopolymerization initiator, at least one photopolymerizable monomer, and a binder.

While known photosensitive resins include those developable with an aqueous alkaline solution and those developable with an organic solvent, the former are preferred from the standpoint of prevention of environmental pollution and safety of the working environment.

The thickness of the photosensitive resin layer is generally from about 0.1 $\mu$m to about 100 $\mu$m. When the photosensitive layer is adhered onto a metal-surface of a substrate, such as a copper-clad substrate, the thickness of the layer is preferably from about 0.1 $\mu$m to about 100 $\mu$m, more preferably from 0.5 to 80 $\mu$m, and particularly preferably from about 0.8 to about 50 $\mu$m, and when the photosensitive layer is used for forming a color filter the thickness of the photosensitive layer is from about 0.1 to about 10 $\mu$m, more preferably from about 0.5 $\mu$m to about 7 $\mu$m, and partaicularly preferably from about 0.8 to about 5 $\mu$m.

The aqueous alkaline solution which can be used as an alkaline developing solution in the present invention is a dilute aqueous solution of an alkaline substance which may contain a small amount of an organic solvent miscible with water. Suitable alkaline substances include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide), and sodium tertiary phosphate. The aqueous alkaline solution preferably contains the alkaline substance in a concentration of from about 0.01 to about 30% by weight and has a pH ranging from about 8 to about 14.

The water-miscible organic solvents which may be present in the aqueous alkaline solution include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetamide, hexamethylphosphoramide, ethyl lactate, methyl lactate, $\epsilon$-caprolactam, and N-methylpyrrolidone. The concentration of the water-miscible organic solvent is from about 0.1 to about 30% by weight. The aqueous alkaline solution may further contain a conventional surface active agent in a concentration preferably of from about 0.01 to about 10% by weight.

The developing solution may be used either as a bath or as a spray. Development, i.e., removal of the unhardened portion of the photosensitive resin layer with the developing solution, can be effected while rubbing the exposed photosensitive resin layer with a rotating brush or wet sponge, etc. The developing solution is preferably used at a temperature of from about 20° to about 60° C., more preferably from about 25° to about 50° C. If necessary, the development step may be followed by a step of washing with water.

After transfer and exposure, removal of the thermoplastic resin layer and the intermediate layer, and development of the photosensitive resin layer to remove the unhardened portion, may be carried out simultaneously. However, in order to reduce unevenness of development or fatigue of the developing solution, the processing of these three layers is preferably carried out in two divided stages in which the thermoplastic resin layer and the intermediate layer are first removed by a processing method by which the photosensitive resin layer is not substantially developed and the photosensitive resin layer is then developed.

As a processing for removal of the thermoplastic resin layer and the intermediate layer the above-described aqueous alkaline solution or the aqueous alkaline solution containing a water-insoluble organic solvent in a small amount may be used. In order to substantially prevent development of the photosensitive resin layer, it is preferred to use an aqueous solution of an alkali compound having a weaker basicity.

The same processing solution as for the photosensitive resin may be used as a processing solution to remove the thermoplastic resin layer and the intermediate layer under milder conditions, such as liquid temperature, spray pressure, rubbing force, etc., than those used for developing the photosensitive resin layer so as to minimize the influences on the photosensitive resin layer. However, where a photosensitive material having two alkali-soluble layers as in the present invention is processed in two stages under different development conditions, it is difficult to stably control the respective processing conditions in actual operations. Moreover, since the processing proceeds slowly, the removal of the thermoplastic resin layer and the intermediate layer requires much time, resulting in poor working efficiency. Hence, two stage processing for minimizing the influence of removal of the thermoplastic resin layer and the intermediate layer on the photosensitive resin layer can be achieved by choosing a processing solution for removing the thermoplastic resin layer and the intermediate layer whose dissolving rate for the thermoplastic resin layer and the intermediate layer is different from that for the photosensitive resin layer. For example, when the processing solution to be used for removing the thermoplastic resin layer and the intermediate layer is such that the minimum time required for development of the photosensitive resin layer is at least twice the minimum time required for removal of the thermoplastic resin layer and the intermediate layer, only the thermoplastic resin layer and the intermediate layer are removed without substantial development of the photosensitive resin layer. After the thermoplastic resin layer and the intermediate layer are removed, the photosensitive resin layer can be developed with a developing solution therefor. In this case, the developing solution for the photosensitive resin layer is prevented from being fatigued by removal of the thermoplastic resin layer and the intermediate layer. Further, since development of the photosensitive resin layer can be conducted with no thermoplastic resin layer or intermediate layer thereon, the photosensitive resin layer is not subject to unevenness of removal which may arise from unevenness of development of the thermoplastic resin layer and, as a result, a uniformly developed image can be obtained.

More specifically, in order to efficiently conduct the removal of the thermoplastic resin layer and the intermediate layer, it is preferable that the thermoplastic resin layer and the intermediate layer be removed with an aqueous solution of an alkaline substance of weaker basicity than the developing solution for the photosensitive resin layer. Weaker basic alkaline substances which can be used in the developing solution for the thermoplastic resin layer and the intermediate layer include ethanolamines, e.g., monoethanolamine, diethanolamine, and triethanolamine, with triethanolamine of weak basicity being particularly preferred.

The concentration of the alkaline substance in the aqueous solution suitably ranges from about 0.01 to about 10% by weight. If it is less than about 0.01% by weight, too much time will be required for removal of the thermoplastic resin layer and intermediate layer and the working efficiency will be reduced. If it exceeds 10% by weight, it is possible that the photosensitive resin layer may also be developed. A particularly preferred concentration is from about 0.1 to about 5% by weight.

The liquid temperature of the processing solution used to remove the thermoplastic resin layer and the intermediate layer is preferably low so as to avoid adverse influences on the photosensitive resin layer, but a too low liquid temperature extends the removal time and reduces the working efficiency. If the liquid temperature exceeds 40° C., it is possible that the photosensitive resin layer may also be developed. Accordingly, a preferred liquid temperature is from 20° to 40° C.

The removal of the thermoplastic resin layer and the intermediate layer may be conducted by using a bath or a spray of the processing solution. The removal may be effected by rubbing with a rotating brush or wet sponge, or by combining these method.

If desired, the photosensitive resin layer may contain dyes or pigments. All the pigments preferably uniformly dispersed in the photosensitive resin layer preferably to a particle size of not greater than aoubt 5 $\mu$m, and particularly not greater than about 1 $\mu$m. In the production of color filters, pigments having a particle size of not greater than about 0.5 $\mu$m are preferred.

Specific examples of suitable dyes or pigments are Victoria Pure Blue BO (C.I. 42595), Auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), Hoster Perm Red ESB (C.I. Pigment Violet 19), Permanent Ruby FBH (C.I. Pigment Red 11), Fastel Pink B Supra (C.I. Pigment Red 81), Mortastral Fast Blue (C.I. Pigment Blue 15), Monolite Fast Black B (C.I. Pigment Black 1), and carbon. Suitable pigments useful in the production of color filters include C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, and C.I. Pigment Blue 64.

It is preferable to provide a thin protective sheet on the photosensitive resin layer for protection against contamination or damage during storage. The protective sheet may be made of the same or similar materials as used as a temporary substrate but must have easy release from the photosensitive resin layer. Suitable protective sheets include silicone paper, a polyolefin sheet, and a polytetrafluoroethylene sheet. The protective sheet preferably has a thickness of from about 5 to 100 μm. An especially preferred protective sheet is a polyethylene or polypropylene film having a thickness of from 10 to 30 μm.

The photosensitive transfer material according to the present invention can be prepared by coating a thermoplastic resin layer coating solution on a temporary substrate followed by drying to form a thermoplastic resin layer, applying an intermediate layer coating solution containing a solvent incapable of dissolving the thermoplastic resin layer on the thermoplastic resin layer followed by drying to form an intermediate layer, and applying a photosensitive resin layer a coating composition containing a solvent incapable of dissolving the intermediate layer on the intermediate layer followed by drying to form a photosensitive resin layer.

The transfer material may also be prepared advantageously by adhering (1) a protective sheet having formed thereon a photosensitive resin layer and (2) a temporary substrate having formed thereon a thermoplastic resin layer and an intermediate layer in this order, with the photosensitive resin layer and the intermediate layer facing each other; or by adhering (1) a temporary substrate having formed thereon a thermoplastic resin layer and (2) a protective sheet having formed thereon a photosensitive resin layer and an intermediate layer in this order, with the thermoplastic resin layer and the intermediate layer facing each other.

When the photosensitive resin layer of the thus prepared photosensitive material is adhered to a permanent substrate and the temporary substrate is stripped off, (usually at room temperature) the film and the human body are electrically charged in some cases to give an irritating electrical shock to the worker. Further, the electrification causes the film to attract dust, which may produce unexposed areas in the subsequent exposure step, causing pinholes.

In order to prevent the electrification, it is preferable to provide an electrically conductive layer on at least one side of the temporary substrate to reduce the surface resistivity of the substrate to about $10^{13}$ Ω or less, and particularly not more than about $10^{12}$ Ω, or the temporary substrate itself may be made electrically conductive so as to have a surface resistivity of not more than about $10^{13}$ Ω, and particularly not more than about $10^{12}$ Ω.

The temporary substrate itself can be rendered electrically conductive by incorporating thereinto a conductive substance, such as fine particles of a metal oxide or an antistatic agent. Suitable metal oxides to be incorporated include at least one crystalline metal oxide selected from zinc oxide, titanium oxide, tin oxide, aluminum oxide, indium oxide, silicon oxide, magnesium oxide, barium oxide, and molybdenum oxide and/or a composite oxide thereof. Suitable antistatic agents to be incorporated include anionic surface active agents, such as alkylphosphate compounds (e.g., "ELECTROSTRIPPER A" produced by Kao Soap Co., Ltd., and "ELENON No. 19" produced by Dai-ichi Kogyo Seiyaku Co., Ltd.); amphoteric surface active agents, such as betaine compounds (e.g., "AMOGEN K" produced by Dai-ichi Kogyo Seiyaku Co., Ltd.); and nonionic surface active agents, such as polyoxyethylene fatty acid esters (e.g., "NISSAN NONION L" produced by Nippon Oils & Fats Co., Ltd.) and polyoxyethylene alkyl ethers (e.g., "EMULGEN 106, 120, 147, 420, 220, 905, and 910" produced by Kao Soap Co., Ltd. and "NISSAN NONION E" produced by Nippon Oils & Fats Co., Ltd.). In addition, other nonionic surface active agents such as polyoxyethylene alkyl phenol ethers, polyhydric alcohol fatty acid esters, polyoxyethylene sorbitan fatty acid esters, and polyoxyethylene alkylamine compounds, may also be employed.

The electrically conductive layer which can be formed on the temporary substrate is properly selected from known conductive layers. Among them, a conductive layer containing fine particles of at least one crystalline metal oxide selected from ZnO, TiO$_2$, SnO$_2$, Al$_2$O$_3$, In$_2$O$_3$, SiO$_2$, MgO, BaO, and MoO$_3$ and/or a composite oxide thereof is preferred because its conductivity is unaffected by humidity. The fine particles of the crystalline metal oxide or composite metal oxide preferably have a volume resistivity of not higher than about $10^7$ Ω.cm, and particularly not higher than about $10^5$ Ω.cm, and a prefered particle size of from about 0.01 to about 0.7 μm, and particularly preferably from about 0.02 to about 0.5 μm.

The details for preparation of the conductive fine particles of the crystalline metal oxide or composite metal oxide are described in JP-A-56-143430 (U.S. Pat. No. 4,495,276). In brief, the conductive fine particles may be obtained by a process comprising preparing fine metal oxide particles by calcining and then subjecting the particles to a heat treatment in the presence of a different atom for improving conductivity, a process comprising preparing fine metal oxide particles by calcining in the presence of a different atom for improving conductivity, or a process comprising preparing fine metal oxide particles by calcining in an atmosphere having a diminished oxygen concentration to introduce oxygen defects. The different atom to be used is, for example, Al or In for ZnO; Nb or Ta for TiO$_2$, or Sb, Nb, or a halogen atom for SnO$_2$. The different atom is preferably added in an amount of from about 0.01 to about 30 mol %, and particularly from about 0.1 to about 10 mol %.

These conductive fine particles are usually used in an amount of from about 0.05 to about 20 g/m$^2$, and preferably of from about 0.1 to about 10 g/m$^2$ of the photosensitive transfer material.

The conductive layer may contain, as a binder, gelatin, a cellulose ester (e.g., cellulose nitrate, cellulose triacetate, cellulose diacetate, cellulose acetate butyrate, and cellulose acetate propionate), a homo- or copolymer formed from vinylidene chloride, vinyl chloride, styrene, acrylonitrile, vinyl acetate, a C$_{1-4}$ alkyl acrylate, vinylpyrrolidone, etc., a soluble polyester, a polycarbonate, a soluble polyamide, and so on. In dispersing the conductive fine particles in the binder, a dispersant, such as a titanium type dispersant or a silane type dispersant, may be added. A binder crosslinking agent may also be used.

The titanium type dispersants to be used include the titanate coupling agents described in U.S. Pat. Nos. 4,069,192 and 4,080,353, and "PLENACT" (trade name) produced by Ajinomoto Co., Inc. Examples of the silane type dispersants to be used include vinyltrichlorosilane, vinyltriethoxysilane, vinyltris(β-methoxyethoxy)silane, γ-glycidoxypropyltri-methoxysilane, and γ-methacryloxypropyltrimethoxysilane. These silane type dispersants are commercially available as silane coupling agents from, e.g., Shin-Etsu Chemical Industry Co., Ltd.

The binder crosslinking agents to be used include epoxy type crosslinking agents, isocyanate type crosslinking agents, and aziridine type crosslinking agents.

A preferred conductive layer is formed by coating a dispersion of the conductive fine particles in a binder on a temporary substrate or by forming a prime coat on a temporary substrate and then adhering conductive fine particles thereto.

Where the conductive layer is provided on the temporary substrate on the side opposite to the photosensitive resin layer, it is preferable to further provide a hydrophobic polymer layer on the conductive layer to assure scratch resistance. The hydrophobic polymer layer can be formed by coating a solution of the polymer in an organic solvent or an aqueous latex of the polymer to a dry weight of from about 0.05 g/m$^2$ to about 1 g/m$^2$ of the photosensitive transfer material.

Examples of suitable hydrophobic polymers include cellulose esters (e.g., nitrocellulose and cellulose acetate), vinyl polymers formed from vinyl chloride, vinylidene chloride, vinyl acrylate, etc., organic solvent-soluble polyamide resins, and polyester resins. The hydrophobic polymer layer may contain slip agents for imparting slip properties, such as organic carboxylic acid amides described in JP-A-55-79435 (U.S. Pat. No. 4,275,146), or matting agents. Such a hydrophobic polymer layer, if provided, exerts substantially no influence upon the effect of the conductive layer. The under coat, if provided, may include vinylidene chloride copolymers as described in JP-A-51-135526 (U.S. Pat. Nos. 4,087,574) and U.S. Pat. No. 3,143,421, 3,586,508, 2,698,235, and 3,567,452; diolefin copolymers formed from butadiene, etc. as described in JP-A-51-114120 (U.S. Pat. Nos. 4,429,039) and 3,615,556; copolymers formed from glycidyl acrylate or glycidyl methacrylate as described in JP-A-51-58469; polyamide-epichlorohydrin resins as described in JP-A-48-24923 (U.S. Pat. No. 3,877,673); and copolymers formed from maleic anhydride as described in JP-A-50-39536 (U.S. Pat. No. 4,124,395).

In addition to the above-described conductive layers, those described in JP-A-56-82504, JP-A-56-143443 (U.S. Pat. No. 4,416,963), JP-A-57-104931, JP-A-57-118242 (U.S. Pat. No. 4,394,441), JP-A-58-62647, and JP-A-60-258541 are also useful.

In a particularly preferred embodiment of the conductive layer formation, a conductive layer is formed by co-extruding a plastic material, which may be the same or different from that of the temporary substrate, containing conductive fine particles together with a film of the temporary substrate. In this case, a conductive layer with excellent adhesion and scratch resistance can easily be obtained, and there is no need to provide the above-mentioned hydrophobic polymer layer or a under coat.

Where a conductive layer is formed by coating, coating may be carried out by any known technique, such as roller coating, air knife coating, gravure coating, bar coating, curtain coating, and the like.

For the purpose of improving slip properties or preventing blocking between the photosensitive resin surface layer and the back of the temporary substrate, it is useful to coat the back of the temporary substrate with a slip composition containing known fine particles or a release composition containing a silicone compound.

Image formation by the use of the photosensitive transfer material according to the present invention can be carried out as follows.

The photosensitive resin layer from which a protective sheet, if any, is removed is adhered onto a permanent substrate under heat or heat-pressure. Adhering may be conducted by means of a known laminator or a known vacuum laminator. An autocut laminator may be used for increasing productivity. Then, the temporary substrate is stripped off, and the photosensitive resin layer transferred to the permanent substrate is exposed to light through a prescribed mask, and generally, also through the thermoplastic resin layer and the intermediate layer, followed by development processing (including removal of the thermoplastic resin layer and the intermediate layer, and which is conducted in one step or in two separated steps as described hereinabove). Development processing can be effected in a known manner, i.e., by soaking in a solvent or an aqueous processing solution, especially an aqueous alkaline solution or by spraying a solvent or an aqueous processing solution, especially an aqueous alkaline solution, while, if desired, rubbing with a brush, etc. or applying ultrasonic waves.

A multicolor image can be formed by repeating the above-mentioned procedure using a plurality of photosensitive transfer materials differing in the color of the photosensitive resin layer.

After forming an image on a parmanent substrate, a photosensitive resin layer having a different color from that of the image is transferred thereon and then exposure and development is conducted. By repeating the formation of images having different colors on the substrate a multicolor image can be obtained.

The photosensitive transfer material of the present invention is advantageously useful mainly in the production of printed circuit boards, the production of color filters for multicolor images, especially liquid crystal displays, and the production of a protective layer of the color filters.

In the production of printed circuit boards, a known copper-clad laminated sheet may be used as a substrate. In the production of color filters, a known glass plate or a soda glass plate having formed thereon a silicon oxide film may be used as a substrate.

The present invention will now be illustrated in greater detail with reference to Examples, but it should be understood that the present invention is not deemed to be limited thereto. All the parts are given by weight unless otherwise indicated.

EXAMPLE 1

A coating composition having formulation H1 shown below was coated on a 100 μm thick polyethylene terephthalate (PET) film as a temporary substrate and dried to form a 20 μm thick thermoplastic resin layer.

| Formulation H1: | |
| --- | --- |
| Methyl methacrylate/2-ethylhexyl acrylate/benzyl methacrylate/methacrylic acid copolymer (copolymerization molar ratio = 55/28.8/11.7/4.5; weight average molecular weight (Mw) = 90000) | 15 parts |
| Polypropylene glycol diacrylate | 6.5 parts |

-continued

| Formulation H1: | |
|---|---|
| (Mw = 822) | |
| Tetraethylene glycol dimethacrylate | 1.5 parts |
| p-Toluenesulfonamide (plastitizer) | 0.5 part |
| Benzophenone (plastitizer) | 1.0 part |
| Methyl ethyl ketone | 30 parts |

A coating composition having formulation B1 shown below was coated on the thermoplastic resin layer and dried to form a 1.6 μm thick intermediate layer.

| Intermediate Layer Formulation B1: | |
|---|---|
| Polyvinyl alcohol ("PVA 205" produced by Kuraray Co., Ltd.; degree of saponification = 80%) | 130 parts |
| Polyvinyl pyrrolidone ("PVP K-90" produced by GAF Corp.) | 60 parts |
| Fluorine containing surfactant ("Surfulon S-131" produced by Asahi Glass Co., Ltd.) | 10 parts |
| Distilled water | 3350 parts |

Photosensitive coating compositions having the formulation shown in Table 1 below were coated on each of four intermediate layers and dried to form photosensitive resin layers colored in black (B1 layer) red (R layer), green (G layer), blue (B layer) respectively having a thickness of 2 μm.

A protective sheet of polypropylene having a thickness of 12 μm was then bonded by processing on each of the photosensitive resin layers to obtain red, blue, green and black photosensitive transfer materials, respectively.

TABLE 1

| Formulation | R Layer (g) | B Layer (g) | G Layer (g) | K Layer (g) |
|---|---|---|---|---|
| Benzyl methacrylate/ methacrylic acid co- polymer (73/27 by mol; viscosity = 0.12) | 60 | 60 | 60 | 60 |
| Pentaerythritol tetra- acrylate (photopoly- merizable monomer) | 43.2 | 43.2 | 43.2 | 43.2 |
| Michler's ketone (photopolymerization initiator) | 2.4 | 2.4 | 2.4 | 2.4 |
| 2-(o-Chlorophenyl)-4, 5-diphenylimidazole dimer (photopoly- merization initiator) | 2.5 | 2.5 | 2.5 | 2.5 |
| Irgazin Red BPT (red) | 5.4 | — | — | — |
| Sudan Blue (blue) | — | 5.2 | — | — |
| Copper phthalo- cyanine (green) | — | — | 5.6 | — |
| Carbon black (black) | — | — | — | 5.6 |
| Methyl cellosolve acetate | 560 | 560 | 560 | 560 |
| Methyl ethyl ketone | 280 | 280 | 280 | 280 |

A color filter was formed by using the resulting color photosensitive transfer materials as follows.

The red photosensitive transfer material from which the protective sheet had been removed was adhered to a 1.1 mm thick transparent glass substrate under heat (130° C.) and pressure (0.8 kg/cm²) by means of a laminator ("VP-II" manufactured by Taisei Laminator K.K.), and the temporary substrate was stripped off the thermoplastic resin layer.

The photosensitive resin layer was exposed to light through a prescribed mask and then developed with a 1% sodium carbonate aqueous solution to remove the unnecessary part thereby to form a pattern of red pixels.

The green photosensitive transfer material was adhered to the glass substrate having thereon the red pattern, stripped off the temporary substrate, exposed to light, and developed in the same manner as above to form a pattern of green pixels.

The same procedure was repeated by using the blue photosensitive transfer material and the black photosensitive transfer material to form a color filter on the transparent glass substrate.

In all the above procedures, the temporary substrate had satisfactory release properties from the respective thermoplastic resin layer. The resulting color filter exhibited satisfactory adhesion to the glass substrate with no lack of pixels and was also free from contamination.

EXAMPLE 2

Color (red, green, blue, and black) photosensitive transfer materials were prepared in the same manner as in Example 1. The red photosensitive transfer material was adhered to a 1.1 mm thick glass substrate in the same manner as in Example 1, and the temporary substrate was stripped at the interface between the thermoplastic resin layer and the substrate and removed.

The red photosensitive resin layer was exposed to light through a prescribed photomask and soaked in a 1% triethanolamine aqueous solution. While being soaked, the thermoplastic resin layer and the intermediate layer were removed by lightly rubbing with a sponge. Then, the unnecessary part of the photosensitive resin layer was removed by developing in a 1% sodium carbonate aqueous solution to form a pattern of red pixels on the glass substrate.

The same procedure was repeated by successively using the green, blue, and black photosensitive transfer materials to form a color filter on the transparent glass substrate.

The resulting color filter suffered from no lack of pixels or color unevenness, exhibited good adhesion to the substrate, and was free from contamination.

Comparative Example 1

Color (red, green, blue, and black) photosensitive transfer materials were prepared in the same manner as in Example 1, except that the thermoplastic resin layer was not formed.

Each of the four color photosensitive transfer materials was successively transferred to a transparent glass substrate, exposed to light, and developed in the same manner as in Example 1 to form a color filter on the glass substrate. After forming a red pattern, each time the other materials were adhered, air bubbles were entrapped between the glass substrate and the photosensitive resin layer. The resulting color filer was observed to suffer from lack of pixels and had poor adhesion to the glass substrate due to the residual air bubbles in the pixels.

EXAMPLE 3

A thermoplastic resin layer having the same formulation as used in Example 1 was coated on a 20 μm thick PET film to a dry thickness of 10 μm in the same manner as in Example 1. The same intermediate layer as in Example 1 was then formed thereon to a thickness of 1.5 μm. A coating composition for a photosensitive resin layer having the following formulation was further coated on the intermediate layer and dried to form a photoresist layer having a thickness of 20 μm.

| Thermoplastic Resin Formulation: | |
|---|---|
| Methyl methacrylate/2-ethylhexyl acrylate/benzyl methacrylate/methacrylic acid copolymer (copolymerization molar ratio = 55/28.8/11.7/4.5; Mw = 90000) | 15 parts |
| Polypropylene glycol diacrylate (Mw = 822) | 6.5 parts |
| Tetraethylene glycol dimethacrylate | 1.5 parts |
| p-Toluenesulfonamide | 0.5 part |
| 1,4-Bis(N,N-diethylamino)benzophenone | 0.04 part |
| Benzophenone | 1.0 part |
| Malachite Green oxalate | 0.02 part |
| 3-Morpholinomethyl-l-phenyltriazole-2-thione | 0.01 part |
| Leuco Crystal Violet | 0.2 part |
| Tribromomethylphenylsulfone | 0.1 part |
| Methyl ethyl ketone | 30 parts |

A 20 μm thick polyethylene film was laminated on the photoresist layer to prepare a dry film photoresist.

The resulting dry film photoresist material from which the polyethylene film had been removed was adhered to a smoothed copper-clad/epoxy resin layer laminated sheet (the copper-clad had 20 μm of thickness) taking care not to entrap air bubbles by means of a heat roll laminator.

The PET surface film was stripped off (the releasability of the PET film was satisfactory), and the photosensitive resin layer was exposed to ultraviolet light through a photomask having a desired circuit pattern of a printed board by means of a printer (manufactured by Orc Co., Ltd.) and then developed with a spray of a 1% sodium carbonate aqueous solution to form an etching resist having a wiring pattern on the copper-clad laminated sheet. The resulting resist image of the wiring pattern exhibited an extremely high resolving power and suffered from no defects such as fall-off.

A cupric chloride etchant was then sprayed onto the patterned copper-clad laminated sheet to dissolve and remove the copper in the area uncovered with the etching resist. The remaining etching resist layer was then removed by spraying a 2% sodium hydroxide aqueous solution thereby to form copper wiring with high resolving power on the epoxy resin base.

Comparative Example 2

A photosensitive transfer material was prepared in the same manner as in Example 3, except that the thermoplastic resin layer was not formed. A resist pattern was formed on a smoothed copper-clad laminated sheet by using the resulting photosensitive transfer material in the same manner as in Example 3. The resulting resist pattern was of no practical use due to many defects of adhesion to the base.

EXAMPLE 4

A multicolor image was formed in the same manner as in Example 1, except that the coating composition for the thermoplastic resin layer (formulation H1) was coated to a dry thickness of 15 μm. No air trapping occurred at each time of transfer. Each color image suffered from no defect. The resulting color filter formed on a glass substrate contained no pinholes.

EXAMPLE 5

A dry film photoresist was prepared in the same manner as in Example 3, except that the photoresist layer had a thickness of 10 μm.

An etching resist having a circuit pattern was formed on a copper-clad laminated sheet in the same manner as in Example 3. The residue of the resin having oozed out from the thermoplastic resin layer on the substrate could not observed on the circumference of the substrate. The resulting resist image exhibited an extremely high resolving power and suffered from no defects such as fall-off.

A cupric chloride etchant was then sprayed onto the patterned copper-clad laminated sheet to dissolve and remove the copper in the area uncovered with the resist. The remaining resist layer was then removed by spraying a 2% sodium hydroxide aqueous solution thereby to form copper wiring with high resolving power and accuracy on the glass/epoxy resin base.

Comparative Example 3

Color photosensitive transfer materials were prepared in the same manner as in Example 1, except that formulation for the thermoplastic resin layer was replaced with the following formulation.

| Formulation: | |
|---|---|
| Dianal BR85 (acrylic resin produced by Mitsubishi Rayon Co., Ltd.; Mw = 250000) | 1.8 parts |
| Dianal BR77 (acrylic resin produced by Mitsubishi Rayon Co., Ltd.; Mw = 80000) | 1.2 parts |
| Trimethylolpropane triacrylate | 1.22 parts |
| Tetraethylene glycol diacrylate | 0.5 part |
| p-Toluenesulfonamide | 0.32 part |
| Benzophenone | 0.008 part |
| Methyl ethyl ketone | 12.6 parts |

No practically usable multicolor image was formed when the resulting color photosensitive transfer materials was processed in the same manner as in Example 1. In this case, the thermoplastic resin layer oozed out at the time of transfer to contaminate the laminater roll and, as a result, the roll contaminated the glass substrate in the subsequent transfer step. Since the thermoplastic resin layer used was not alkali-soluble, it could not be removed with the aqueous alkaline solution.

Comparative Example 4

A photosensitive transfer material was prepared in the same manner as in Example 3, except that the thermoplastic resin layer of Example 3 was replaced with that used in Comparative Example 3. When a resist pattern was formed on a smoothed copper-clad laminated sheet by using the resulting transfer material in the same manner as in Example 3, no usable image was formed and it was observed that the residue of the resin oozed out from the thermoplastic resin layer remained around the image area. After etching, the copper layer beneath the resin residue remained unetched.

Comparative Example 5

Color photosensitive transfer materials were prepared in the same manner as in Example 1, except that the intermediate layer was formed by using the following formulation containing no polyvinyl pyrrolidone.

| Formulation: | |
|---|---|
| Polyvinyl alcohol ("PVA 205" produced by Kuraray Co., Ltd.) | 190 parts |
| Fluorine-containing surfactant ("Surfulon S-131" produced by Asahi Glass Co., Ltd.) | 10 parts |
| Distilled water | 3350 parts |

By this method, red, blue, green and black photosensitive transfer materials were prepared. The red photosensitive transfer material from which the protective sheet had been removed was adhered to a 1.1 mm thick transparent glass substrate under heat (130° C.) and pressure (0.8 kg/cm²) by means of a laminator ("VP-II" produced by Taisei Raminator). Thereafter, stripping of the temporary substrate at the interface between the substrate and the thermoplastic resin layer was attempted, but the release at this interface could not be effected and the release partly took place between the red photosensitive resin layer and the intermediate layer. As a result, the portion at the red photosensitive resin layer on the transparent glass substrate where the intermediate layer had come off together with the temporary substrate underwent the influence of oxygen and suffered from a considerable reduction in sensitivity.

EXAMPLES 6 to 10

Temporary substrates (a) to (g) comprising a 100 μm thick PET film having formed on one side thereof a conductive layer having a varied surface resistivity were prepared.

Preparation of Substrate (a):

In 1000 parts of ethanol were dissolved 65 parts of stannic chloride hydrate and 1.5 parts of antimony trichloride to prepare a uniform solution. A 1N sodium hydroxide aqueous solution was added thereto dropwise until the solution was adjusted to pH 3. The thus formed co-precipitate of colloidal stannic oxide and antimony oxide was allowed to stand at 50° C. for 24 hours to obtain a red brown colloidal precipitate, followed by centrifugation to separate the precipitate. Water was added to the collected precipitate, followed by centrifugation to remove excess ions. This washing operation was repeated three times.

A hundred parts of the washed precipitate were mixed with 1000 parts of water, and the mixture was atomized into a baking furnace set at 650° C. to obtain blue-tinted conductive fine particles having an average particle size of 0.15 μm.

The resulting conductive fine particles were dispersed in the following system for 5 hours by means of a paint shaker (manufactured by Toyo Seizai Seisakusho).

| Dispersion System: | |
|---|---|
| Conductive fine particles | 200 parts |
| Saran F-310 (trade name:vinylidene chloride-based copolymer produced by Asahi Dow Ltd.) | 10 parts |
| Methyl ethyl ketone | 150 parts |

A coating composition for a conductive layer was prepared according to the following formulation by using the resulting dispersion of the conductive fine particles.

| Formulation: | |
|---|---|
| Dispersion prepared above | 15 parts |
| Saran F-310 | 3 parts |
| Methyl ethyl ketone | 100 parts |
| Cyclohexanone | 20 parts |
| m-Cresol | 5 parts |

The resulting coating composition was coated on a 100 μm thick PET film to a dry weight of 1.3 g/m² and dried at 130° C. for 2 minutes.

Further, a coating composition having the following formulation was coated thereon to a dry weight of 0.2 g/m² and dried at 130° C. for 1 minute.

| Formulation: | |
|---|---|
| Cellulose triacetate | 1 part |
| Methylene dichloride | 60 parts |
| Ethylene dichloride | 40 parts |
| Erucic amide | 0.01 part |

Substrate (a) thus prepared had a surface resistivity of $7 \times 10^8 \Omega$ at 25° C., 25% RH as measured with an insulation resistance meter ("VE-30" manufactured by Kawaguchi Denkyoku K.K.).

Preparation of Substrates (b) to (q):

Substrates (b) to (g) were prepared in the same manner as for substrate (a), except for changing the amount of the conductive fine particles. The surface resistivities of the resulting substrates are shown below.

TABLE 2

| Substrate | Surface Resistivity |
|---|---|
| (b) | $10^{10} \Omega$ |
| (c) | $10^{11} \Omega$ |
| (d) | $10^{12} \Omega$ |
| (e) | $10^{13} \Omega$ |
| (f) | $10^{9} \Omega$ |
| (g) | $10^{14} \Omega$ |

The same thermoplastic resin layer, intermediate layer and photosensitive resin layer as used in Example 4 were successively formed on each of substrates (a) to (g) on the side opposite to the conductive layer. A 12 μm thick polypropylene protective film was bonded by pressing on the photosensitive resin layer to prepare color (red, blue, green, and black) photosensitive transfer materials.

A color filter was formed by using the resulting transfer materials in the same manner as in Example 1. The resulting color filter obtained using the materials each having substrate (a) to (f), respectively, suffered from no lack of pixels and exhibited satisfactory adhesion to the substrate in each case. Further, no shock of static electricity was felt on stripping the temporary substrate in each case.

In the production of a color filter using the transfer materials having substrate (g) or having a substrate (which had a surface resistirity of $10^{15}\Omega$) on which not provide a conductive layer, respectively, electrical shock was felt on stripping the temporary substrate. The resulting color filter had a small number of pinholes in the pixels attributed to adhered dust.

Comparative Example 6

Color (red, green, blue, and black) photosensitive transfer materials were prepared in the same manner as in Example 1, except that the thermoplastic resin layer had a thickness of 5 μm.

A color filter was formed on a transparent glass substrate by using the resulting transfer materials in the same manner as in Example 1. In this case, after forming a red pattern, each time the other transfer materials were adhered, air bubbles were entrapped under the photosensitive resin layer. The resulting color filter was observed to suffer from lack of pixels and had poor adhesion to the glass substrate due to the residual air bubbles in the pixels.

Comparative Example 7

A photosensitive transfer material was prepared in the same manner as in Example 2, except that the thermoplastic resin layer had a thickness of 5 μm. A resist pattern was formed on a smoothed copper-clad laminated sheet by using the resulting transfer material in the same manner as in Example 3. A pattern image was obtained, but the resulting resist was of no practical use due to many occurrences of poor adhesion to the substrate.

While the invention has been described in detail and with reference to specific examples thereof, it will be apparent to one skilled in the art that various changes and modifications can be made therein without departing from the spirit and scope thereof.

What is claimed is:

1. A method for forming an image comprising the steps of:

adhering a photosensitive resin layer of a photosensitive transfer material comprising a temporary substrate having provided thereon an alkali-soluble thermoplastic resin layer, an intermediate layer, and a photosensitive resin layer in this order, the interlaminar adhesion in said transfer material being the smallest at the interface between said thermoplastic resin layer and said temporary substrate, to a permanent substrate under at least heat, stripping said temporary substrate from said thermoplastic resin layer, imagewise exposing the photosensitive resin layer to light, and processing the photosensitive transfer material to develop the photosensitive resin layer to form an image on said permanent substrate.

2. A method for forming an image as claimed in claim 1, wherein said steps are repeated by using at least two photosensitive transfer materials differing in the color of the photosensitive resin layers thereof to form multicolor image on the parmanent substrate.

3. A method for forming an image as claimed in claim 1, wherein the processing step comprises i) removing the alkali-soluble thermoplastic resin layer and the intermediate layer with a processing solution which does not substantially develop the photosensitive resin layer and ii) developing the photosensitive resin layer using a developing solution which is different from the processing solution used in i).

* * * * *